United States Patent
Lin et al.

(10) Patent No.: US 8,941,098 B2
(45) Date of Patent: Jan. 27, 2015

(54) LIGHT DETECTING ARRAY STRUCTURE AND LIGHT DETECTING MODULE

(75) Inventors: Yan-Rung Lin, Hsinchu (TW); Chang-Ho Liou, Changhua County (TW); Sheng-Fu Horng, Kaohsiung (TW); Jen-Chun Wang, Chiayi (TW); Yun-Ru Hong, Hsinchu (TW); Ming-Kun Lee, Hsinchu (TW); Hsin-Fei Meng, New Taipei (TW)

(73) Assignees: Industrial Technology Research Institute, Hsinchu (TW); National Tsing Hua University, Hsinchu (TW)

( * ) Notice: Subject to any disclaimer, the term of this patent is extended or adjusted under 35 U.S.C. 154(b) by 365 days.

(21) Appl. No.: 13/473,617

(22) Filed: May 17, 2012

(65) Prior Publication Data
US 2013/0168643 A1    Jul. 4, 2013

(30) Foreign Application Priority Data
Dec. 29, 2011    (TW) .............................. 100149590 A

(51) Int. Cl.
H01L 29/08    (2006.01)

(52) U.S. Cl.
USPC ................... 257/40; 257/13; 257/29; 257/76; 257/88

(58) Field of Classification Search
None
See application file for complete search history.

(56) References Cited

U.S. PATENT DOCUMENTS

| | | | |
|---|---|---|---|
| 5,196,702 A | 3/1993 | Tsuji et al. | |
| 7,592,539 B2 | 9/2009 | Peumans et al. | |
| 2009/0095882 A1* | 4/2009 | Liu et al. | 250/208.1 |
| 2010/0283043 A1 | 11/2010 | Nishimura et al. | |
| 2011/0279020 A1 | 11/2011 | Inoue et al. | |

FOREIGN PATENT DOCUMENTS

| | | |
|---|---|---|
| JP | 2011006665 | 1/2011 |
| TW | 200845447 | 11/2008 |
| TW | 201105633 | 2/2011 |
| TW | 201113265 | 4/2011 |

OTHER PUBLICATIONS

Wang et al., "Highly efficient flexible inverted organic solar cells using atomic layer deposited ZnO as electron selective layer", Journal of Materials Chemistry, Dec. 23, 2009, pp. 862-866, vol. 20.
Shaheen et al., "Inverted bulk-heterojunction plastic solar cells", SPIE, May 24, 2007, pp. 1-3.

(Continued)

Primary Examiner — Kyoung Lee
(74) Attorney, Agent, or Firm — Jianq Chyun IP Office

(57) ABSTRACT

A light detecting array structure and a light detecting module are provided. The light detecting array structure includes a plurality of first electrodes, a plurality of second electrodes, a first carrier selective layer, a second carrier selective layer, and a light-absorbing active layer. The second electrodes are disposed on one side of the first electrodes. Between the first electrodes and the second electrodes, a first carrier selective layer, a light-absorbing active layer and a second carrier selective layer are disposed. The light detecting module includes the light detecting array structure and a control unit. The control unit is coupled to the first electrodes and second electrodes, selectively provides at least two cross voltages between each of the first electrodes and each of the second electrodes, and reads photocurrents flowing through the first electrodes and second electrodes.

28 Claims, 8 Drawing Sheets

(56) References Cited

OTHER PUBLICATIONS

Tedde et al., "Active Pixel Concept Combined With Organic Photodiode for Imaging Devices", IEEE Electron Device Letters, Oct. 2007, pp. 893-895, vol. 28, No. 10.

Kim et al., "New Architecture for High-Efficiency Polymer Photovoltaic Cells Using Solution-Based Titanium Oxide as an Optical Spacer", Advanced Materials, Mar. 2, 2006, pp. 572-576, vol. 18.

"Office Action of Taiwan Counterpart Application", issued on Aug. 21, 2014, p. 1-p. 5.

\* cited by examiner

LIGHT DETECTING ARRAY STRUCTURE AND LIGHT DETECTING MODULE

CROSS-REFERENCE TO RELATED APPLICATION

This application claims the priority benefit of Taiwan application serial no. 100149590, filed on Dec. 29, 2011. The entirety of the above-mentioned patent application is hereby incorporated by reference herein and made a part of this specification.

BACKGROUND

1. Technical Field

The disclosure relates to a detecting module and a structure thereof, and in particular, to a light detecting array structure and a light detecting module.

2. Related Art

A photo-sensor is a significant device in modern technology and may be applied to various detectors, such as an electronic skin, a proximity sensor, a biosensor or a chemical sensor. Based on different selected materials, the photo-sensor may be classified into a photo-sensor with an organic material and with an inorganic material. As one of flexible electronic applications, unlike a conventional charge-coupled device (CCD) or a complementary metal-oxide-semiconductor (CMOS), the photo-sensor with the organic material may be constructed on a plastic or a metal substrate to provide flexibility. In the conventional photo-sensor array, in order to independently read a specific detector, a selector switch is additionally disposed outside the photo-sensor and a specific photo-sensor is read by operating the selector switch. The additional selector switch may be a transistor or a diode, which increases the manufacturing difficulty, cost and time, and reduces production yield.

SUMMARY

A light detecting array structure is introduced in an exemplary embodiment, which includes a plurality of first electrodes and a plurality of second electrodes. The second electrodes are disposed at one side of the first electrodes, and each of the first electrodes intersects each of the second electrodes, in which a pixel is formed at an intersecting place of each of the first electrodes and each of the second electrodes. Between the first electrodes and the second electrodes, a first carrier selective layer, a second carrier selective layer and a light-absorbing active layer are included. The first carrier selective layer is disposed between the first electrodes and the second electrodes, and the second carrier selective layer is disposed between the first carrier selective layer and the second electrodes. The light-absorbing active layer is disposed between the first carrier selective layer and the second carrier selective layer.

A light detecting module is introduced in an exemplary embodiment, which includes the light detecting array structure and a control unit. The control unit is coupled to the first electrodes and the second electrodes, and selectively provides at least two cross voltages between each of the first electrodes and each of the second electrodes. The control unit is configured to read photocurrents flowing through the first electrodes and the second electrodes.

Several exemplary embodiments accompanied with figures are described in detail below to further describe the embodiments in details. One of the ordinary skill in the art will understand not all objects or advantages may be presents in all embodiments.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
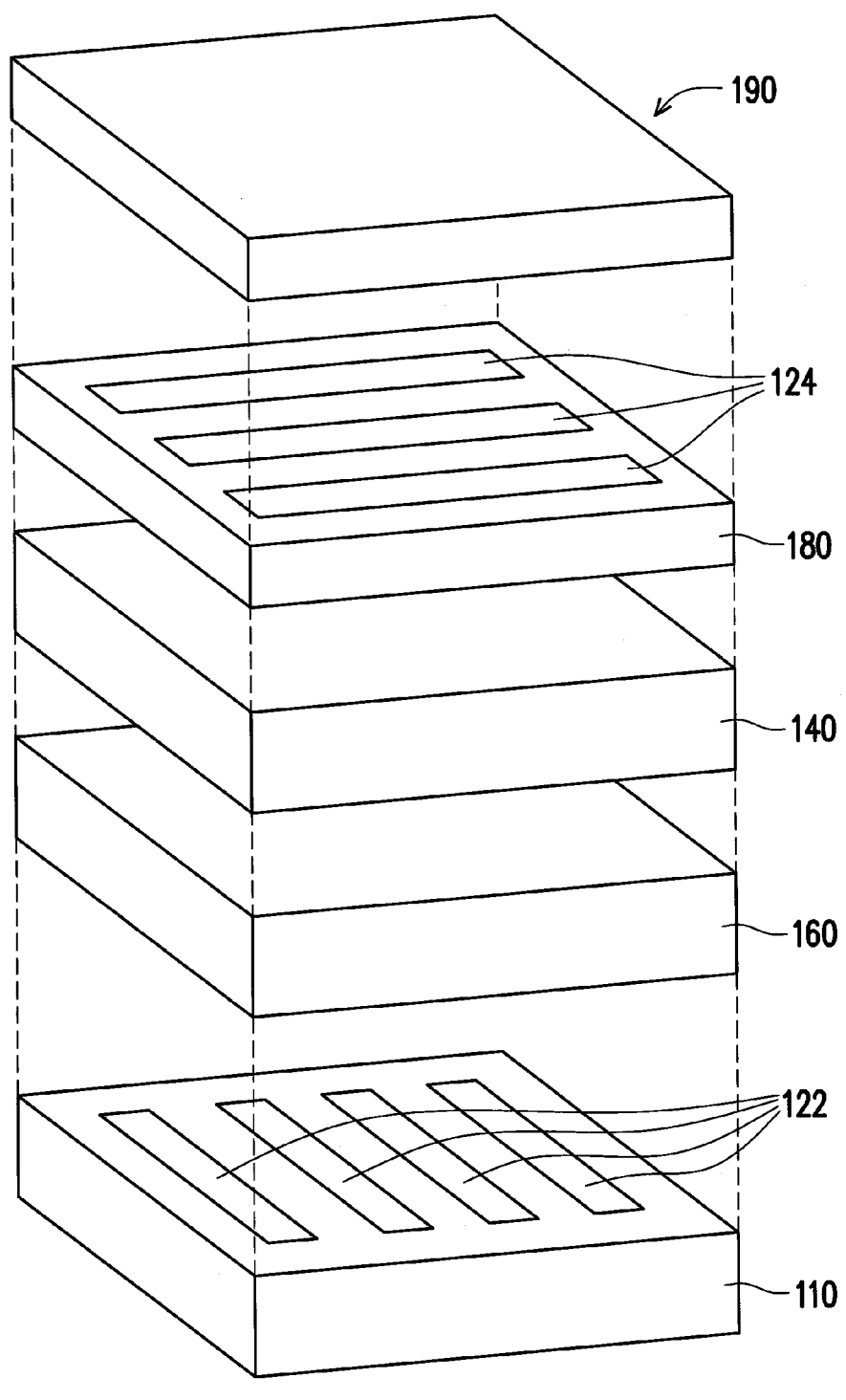
FIG. 1 is an exploded view of a light detecting array structure according to an exemplary embodiment.

FIG. 1 is an exploded view of a light detecting array structure according to an exemplary embodiment. Referring to FIG. 1, the light detecting array structure 100 of this embodiment includes a plurality of first electrodes 122, a plurality of second electrodes 124, a first carrier selective layer 160, a second carrier selective layer 180, and a light-absorbing active layer 140.

Figure 2:
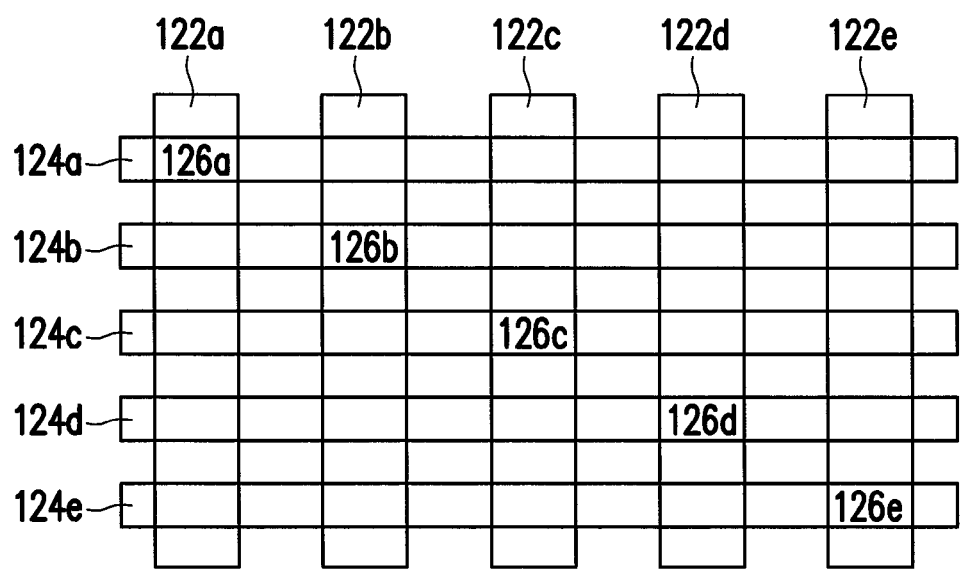
FIG. 2 is a top view of a relative space between two kinds of electrodes according to an exemplary embodiment.

In this embodiment, the first electrodes 122 of the light detecting array structure 100 are, for example, strip-like electrodes, and the material thereof is a conductive material. The first electrodes are parallel to each other and separated from each other, and are plated on a first substrate 110. The first substrate 110 may be a flexible substrate or a hard substrate, in which the flexible substrate is, for example, a plastic substrate, and the hard substrate is, for example, a glass substrate. The second electrodes 124, are for example, strip-like electrodes, and the material thereof is a conductive material. The second electrodes are parallel to each other and separated from each other, and are disposed at one side of the first electrodes 122. FIG. 2 is a top view of a relative space between two kinds of electrodes according to an exemplary embodiment. Referring to FIG. 2, although other films may be disposed between the first electrodes 122 and the second electrodes 124, on a three-dimensional relative position, the first electrodes 122 intersect the second electrodes 124, and a pixel is formed at an intersecting place of each of the first electrodes 122 and each of the second electrodes 124. In this embodiment, each of the first electrodes 122a-122e is perpendicular to each of the second electrodes 124a-124e, which is like a column-and-row line structure of a checkerboard and forms multiple intersecting places 126a-126e. However, in other embodiments, each of the first electrodes 122a-122e and each of the second electrodes 124a-124e may make an angle greater than 0 degree and less than 90 degrees. In order that an external beam passes through the first electrodes 122 or the second electrodes 124 and excites a photocurrent, at least one set of the first electrodes 122 and the second electrodes 124 may be a light transmissive electrode (e.g. a transparent electrode) for the beam to pass through, and the material of the other set may be metal or other conductive materials, such as silver.

Returning to FIG. 1, in an embodiment, the light-absorbing active layer 140 is an organic light-absorbing active layer, and a material thereof is, for example, a mixture of poly(3-hexylthiophene) and phenyl-C61-butyric acid methyl ester (P3HT:PCBM). When an external beam enters through other structures, the light-absorbing active layer 140 may absorb energy of the light, and then generate the photo current.

In this embodiment, the first carrier selective layer 160 is an electron selective layer, that is, a hole blocking layer, and a material thereof is, for example, titanium dioxide or zinc oxide. In addition, the second carrier selective layer 180 is a hole selective layer, that is, an electron blocking layer, and a material thereof is, for example, poly(3,4-ethylenedioxythiophene) poly(styrenesulfonate) (PEDT:PSS) or molybdenum trioxide. Due to the influence of the first carrier selective layer 160, the hole slows down in this layer, and it is difficult for the hole to pass through the layer. In other words, in the first carrier selective layer 160, the mobility of electrons is greater than the mobility of holes. Due to the influence of an energy barrier of the second carrier selective layer 180, the electron slows down in the second carrier selective layer 180, and it is also difficult for the electron to pass through second carrier selective layer 180. On the contrary, in this layer, the mobility of holes is greater than the mobility of electrons. In this embodiment, the light detection array structure 100 further includes a second substrate 190 disposed at one side of the second electrode 124 and for protecting the light detecting array structure 100. In another embodiment, a protective layer may be configured to replace the second substrate 190, and covers the second electrodes 124.

In this embodiment, the light detecting array structure 100 is a multi-layer film structure, in which the light-absorbing active layer 140, the first carrier selective layer 160 and the second carrier selective layer 180 are continuous films, and a thickness of each layer may be adjusted according to the actual requirements. Unlike the electrodes at two sides, the continuous film is, for example, coated on the first substrate 110 in whole. Due to the process temperature and the process conditions, the light detecting array structure is compatible with different kinds of substrate, not limited to a flexible substrate or a plastic package.

Figure 3A:
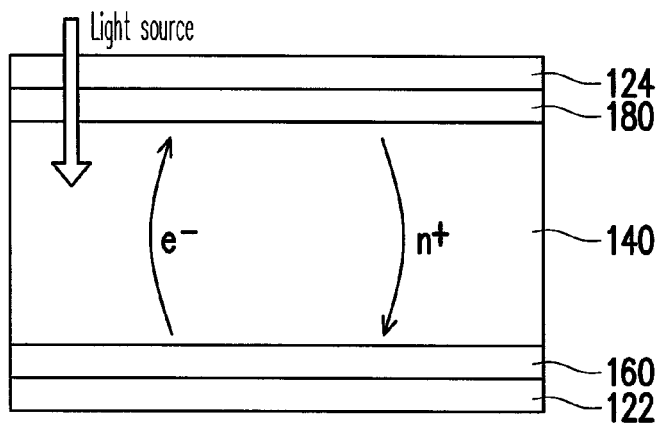
FIG. 3A is a sectional view of a light detecting array operating at an intersecting place of two electrodes at two sides without a bias voltage according to an exemplary embodiment.
Figure 3B:
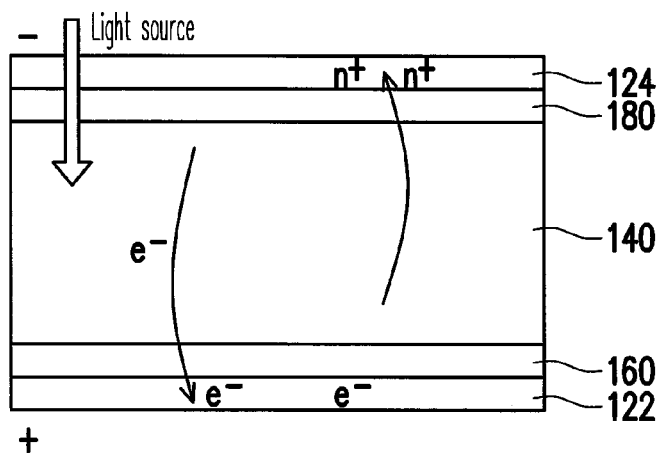
FIG. 3B is a sectional view of a light detecting array operating at an intersecting place of two electrodes at two sides under a reverse bias voltage according to an exemplary embodiment.
Figure 3C:
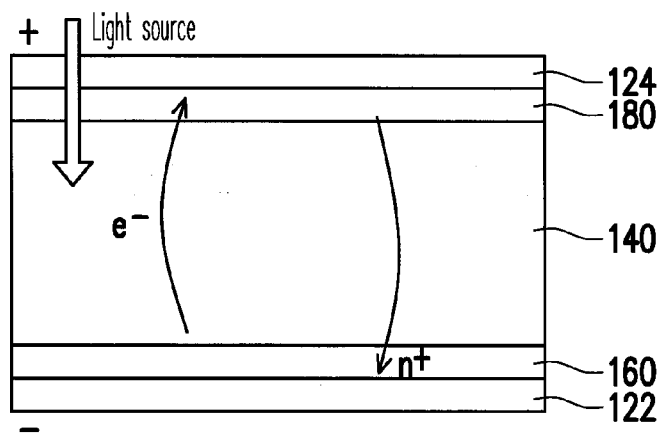
FIG. 3C is a sectional view of a light detecting array operating at an intersecting place of two electrodes at two sides under a forward bias voltage according to an exemplary embodiment.

FIG. 3A to FIG. 3C illustrate an operation of the light detecting array in FIG. 1. Referring to FIG. 1 and FIG. 3A to FIG. 3C, sectional views of any intersecting place 127 of the electrodes at two sides are shown. When the light passes through a transmissive electrode at one side, the energy of the light is adsorbed by the light-absorbing active layer 140 and then bounded electron-hole pairs (excitons) are generated. The electron and the hole in the electron-hole pair are respectively transited to a lowest unoccupied molecular orbital (LUMO) and a highest occupied molecular orbital (HOMO), and respectively move in opposite directions due to the influence of an inner electric field.

Referring to FIG. 3A, in the case that no voltage is applied externally, an excited electron generated in the light-absorbing active layer 140 moves towards the second electrode 124 due to the influence of the inner electric field, and an excited hole moves towards the first electrodes 122. However, when moving towards the second electrodes 124, the excited electron is first blocked by the second carrier selective layer 180 (that is, the hole selective layer), so it is difficult for the excited electron to reach the second electrodes 124. Likewise, the excited hole moved towards the first electrodes 122 is also blocked by the first carrier selective layer 160 (that is, the electron selective layer), so it is also difficult for the excited hole to reach the first electrodes 122. Therefore, without a bias voltage, almost no photocurrent flows out of the intersecting place 127, of the two electrodes at two sides, of the light detecting array structure.

FIG. 3B illustrates a case in which a reverse bias voltage is applied, and at this time, the voltage externally applied to the first electrodes 122 is greater than the voltage externally applied to the second electrodes 124. When the voltage applied to the first electrodes 122 minus that the voltage applied to the second electrodes 124 is greater than or equal to a threshold value, the photo-excited holes-electron pair moves in a direction different from that in FIG. 3A. Since the first carrier selective layer 160 is in front of the first electrodes 122, the excited electron moves towards the first electrodes 122 and the hole will be blocked. It means that the excited electron endures a lower blocking degree when passing through the first carrier selective layer 160. The first electrodes 122 collect the excited electron moving towards the first electrodes 122. The excited hole moving towards the second electrodes 124 may reach the second electrodes 124 and may be collected since the second carrier selective layer 180 is the hole selective layer. Therefore, in the case of the reverse bias voltage, the photocurrent generated in the intersecting place 127 may be measured.

Considering a case that a forward bias voltage is externally applied at the intersecting place 127, referring to FIG. 3C, the voltage externally applied to the first electrodes 122 is less that the voltage externally applied to the second electrodes 124. The electron and the hole of the excited hole-electron pair generated by the light-absorbing active layer 140 move in the same directions as the directions without an externally applied voltage, and the electron is still blocked by the second carrier selective layer 180 and the hole is still blocked by the first carrier selective layer 160, so almost no photocurrent is generated. However, when the forward bias voltage is large enough, the electron and the hole of the electrodes at two sides may flow therein, and a current is possibly generated whether the photocurrent is generated or not.

Figure 4A:
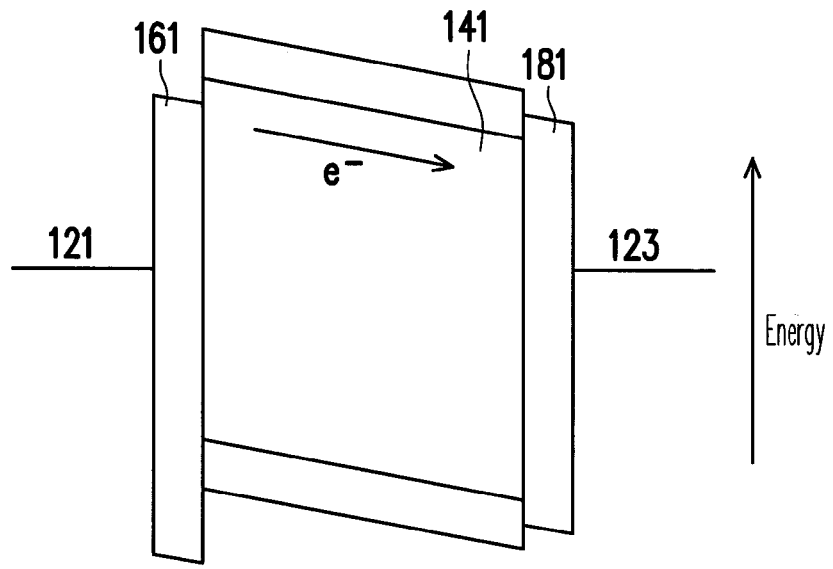
FIG. 4A is a schematic energy band view of a light detecting array operating at an intersecting place of two electrodes at two sides without a bias voltage according to an exemplary embodiment.
Figure 4B:
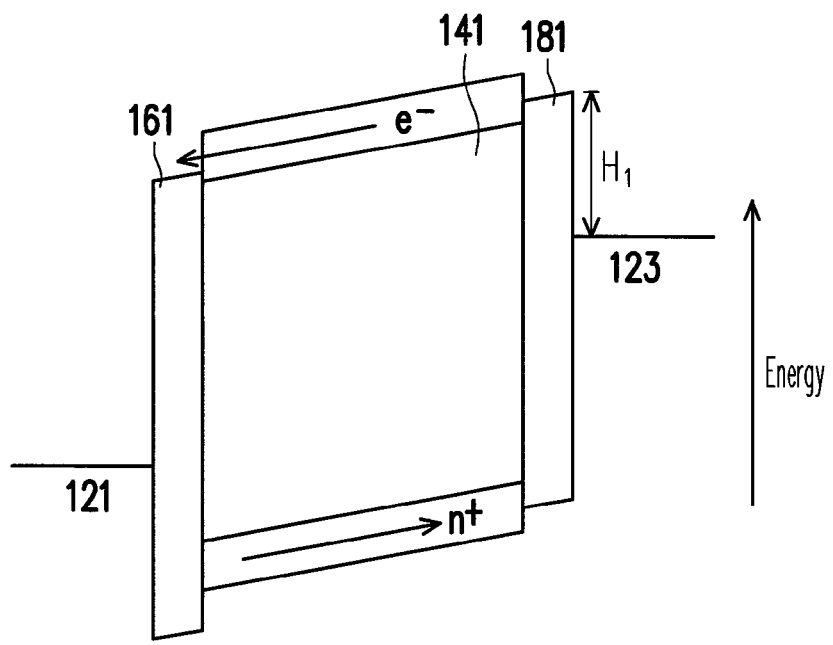
FIG. 4B is a schematic energy band view of a light detecting array operating at an intersecting place of two electrodes at two sides under a reverse bias voltage according to an exemplary embodiment.
Figure 4C:
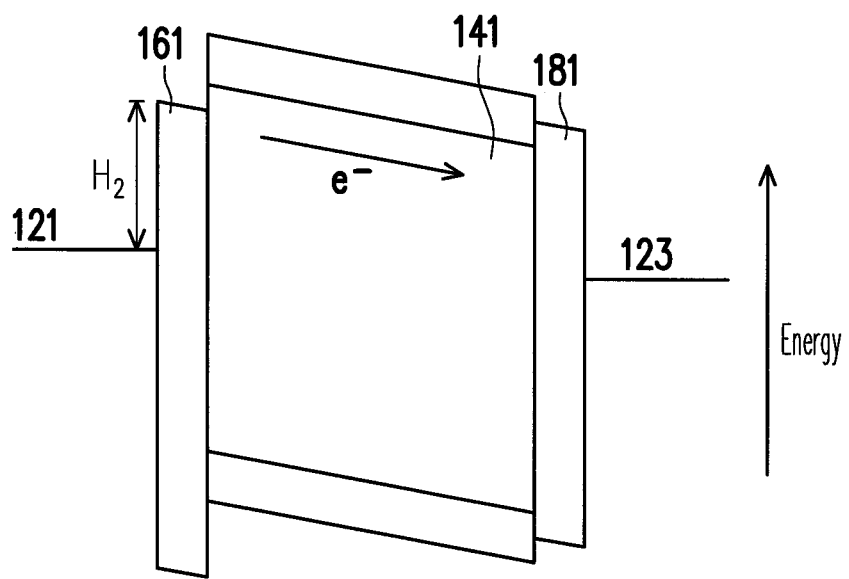
FIG. 4C is a schematic energy band view of a light detecting array operating at an intersecting place of two electrodes at two sides under a forward bias voltage according to an exemplary embodiment.

In FIG. 4A, FIG. 4B, and FIG. 4C are schematic energy band views in consideration of zero bias voltage, a reverse bias voltage and a forward bias voltage in FIG. 3A to FIG. 3C. An energy band 121 is an energy band of the first electrodes 122. The first electrodes 122 are transparent conductive films made of material of indium tin oxide (ITO). An energy band 161 is an energy band of the first carrier selective layer 160, in which a material of the first carrier selective layer 160 is, for example, titanium dioxide ($TiO_2$). An energy band 141 is an energy band of the light-absorbing active layer 140, in which a material of the light-absorbing active layer 140 is, for example, a mixture of poly(3-hexylthiophene) and phenyl-C61-butyric acid methyl ester (P3HT:PCBM). An energy band 181 is an energy band of the second carrier selective layer 180, in which a material of the second carrier selective layer 180 is, for example, poly(3,4-ethylenedioxythiophene) poly(styrenesulfonate). In addition, an energy band 123 is an energy band of the second electrodes 124, in which a material of the second electrode 124 is, for example, silver (Ag).

As shown in FIG. 4A, in the case of the zero bias voltage, the energy bands of the two carrier selective layers both can block the photo-excited electron-hole pair. In the case of the reverse bias voltage, a voltage applied to the first electrodes 122 is larger than that applied to the second electrodes 124. Referring to FIG. 4B, the energy band 181 of the second carrier selective layer 180 is higher the energy band 161 of the first carrier selective layer 160, and the excited electron may pass through the first carrier selective layer 160 and reach the first electrode 122 in the influence of the reverse bias voltage. The excited hole also passes through the second carrier selective layer 180 and reaches the second electrodes 124. In addition, due to an energy barrier H1, it is difficult for an electron to flow into the inner layers of light detecting array structure from the second electrodes 124 in the influence of the externally applied voltage. In FIG. 4C, in the case of the forward bias voltage, a voltage applied to the second electrodes 124 is larger than that applied to the first electrodes 122. At this time, the energy band 161 of the first carrier selective layer 160 is higher than the energy band 181 of the second carrier selective layer 180. However, the excited electron is also blocked by the second carrier selective layer 180, so it is difficult for the excited electron to pass through the second carrier selective layer 180 and reach the second electrodes 124. The excited hole is also blocked by the first carrier selective layer 160, so it is difficult for the excited hole to reach the first electrodes 122. Due to the influence of an energy barrier H2, it is difficult for an electron to flow into the inner layers of light detecting array structure from the first electrodes 122 in the influence of the externally applied voltage, except in the condition that the forward bias voltage is large over a sufficient degree, i.e. the forward bias voltage is greater than $V_3$ shown in FIG. 5 and described hereinafter.

Figure 5:
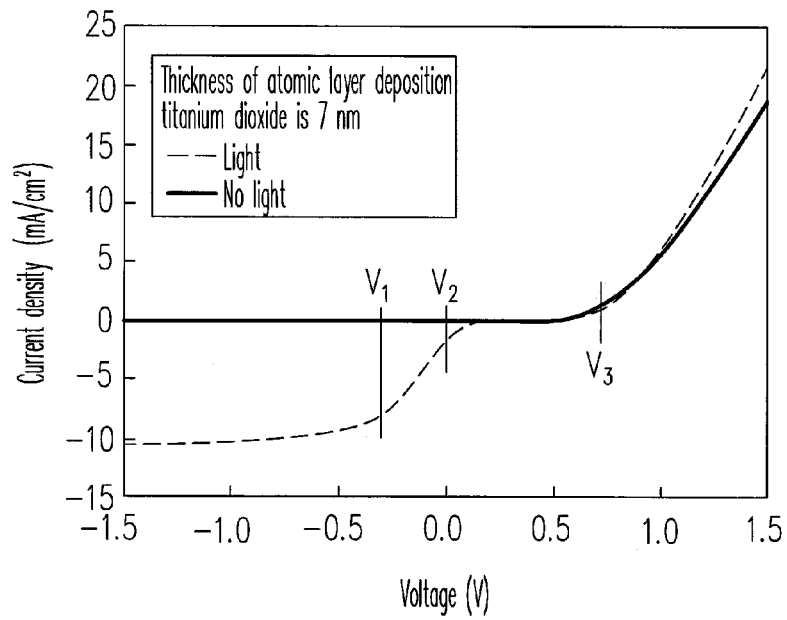
FIG. 5 is a schematic current density to voltage curve (J-V curve) graph of operation of the light detecting array structure of FIG. 1.

FIG. 5 is a schematic current density to voltage curve (J-V curve) graph of operation of the intersecting place of the light detecting array structure of FIG. 1. In this embodiment, an atomic layer deposition layer of titanium dioxide with a proper thickness, for example fews of or tens of nm, or 7 nm, is selected as the first carrier selective layer. With a light illumination and the reverse bias voltage, whose absolute value is greater than a first value, for example the absolute value of $V_1$, referring to the broken line curve in FIG. 5, a photocurrent of the light-absorbing active layer excited by the light illumination will be detected. In this embodiment, when the voltage applied to the first electrode 122 minus the voltage applied to the second electrode 124 is positive and is greater than the first value (i.e. the absolute value of $V_1$), the photocurrent is in a saturation state, which means the magnitude of the photocurrent is less influenced by the magnitude of the reverse bias voltage in this state. If no light illumination, there is no current, as shown by the solid line curve. When a forward bias voltage is applied and is greater than a second value, for example, $V_3$ shown in FIG. 5, whether light illumination exists or not, a current exists. A current is generated under an external electric field. In the case of light illumination with fixed strength, when an absolute value of the reverse bias voltage is less than a threshold value, for example, the absolute value of $V_2$ shown in FIG. 5, the current is decreased with the reduction of the absolute value of the reverse bias voltage, and finally is almost zero.

Figure 6:
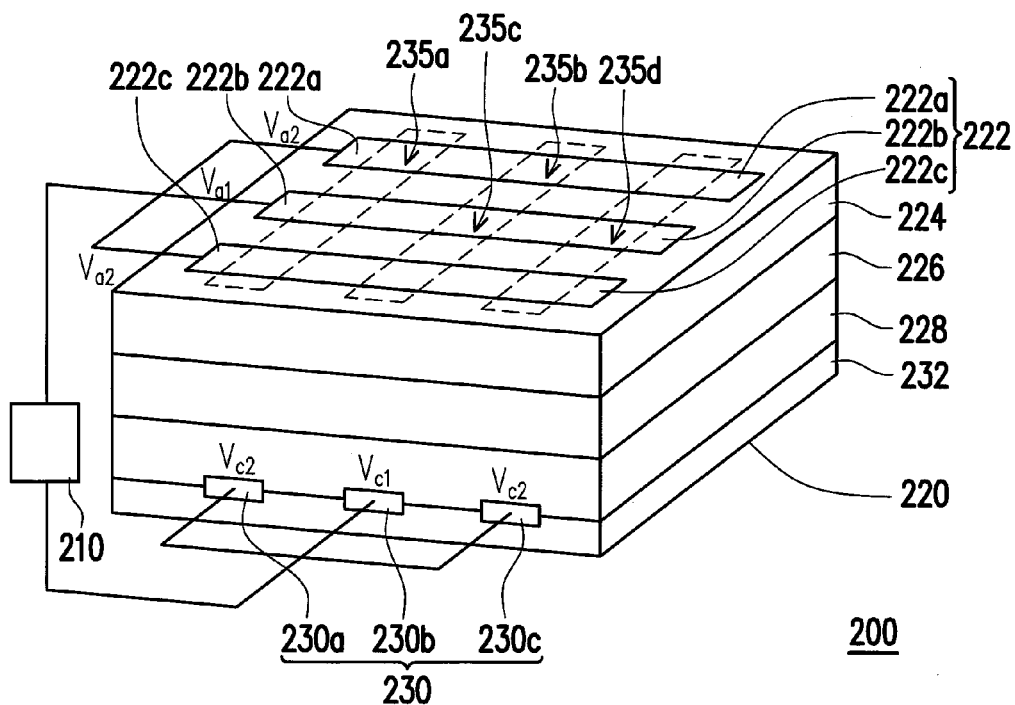
FIG. 6 is a simple schematic view of a light detecting module according to an exemplary embodiment.

FIG. 6 is a simple schematic view of a light detecting module according to an exemplary embodiment. On the basis of the structure of the light detecting array structure in the above embodiments, a light detecting module 200 may be established, and a light detecting array 220 is the same as the light detecting array structure 100 in the simple view of FIG. 1, which includes, from top to bottom, second electrodes 222, a second carrier selective layer 224, a light-absorbing active layer 226, a first carrier selective layer 228, first electrodes 230, and a first substrate 232. This embodiment further includes a second substrate, not depicted, disposed at one side of the second electrode 222, which is not shown in FIG. 6 in order that FIG. 6 can clearly illustrate the light detecting module. A control unit 210 is connected to the light detecting array 220, and selectively provides at least two cross voltages between each of the first electrodes 230 and each of the second electrodes 222, and reads photocurrents flowing through the first electrodes 230 and the second electrodes 222.

The first electrodes 230 and the second electrodes 222 are, for example, strip-like electrodes, and each of the first electrodes 230 is perpendicular to each of the second electrodes 222 at a three-dimensional relative position, which is like a column-and-row line structure of a checkerboard and forms multiple intersecting places 235a-235d.

In an embodiment, the control unit 210 is coupled to each of the first electrodes 230 and each of the second electrodes 222. The light-absorbing active layer 226 is an evenly coated film. To independently read the single intersecting place, the absolute value of a reverse bias voltage at the intersecting place is greater than or equal to the threshold value, i.e. the absolute value of $V_2$. The control unit 210 is used for reading and analysis, and further determining light illumination strength of the intersecting place. Different cross voltages are applied to other intersecting places so that the generated photocurrent does not affect a photocurrent at the specific intersecting place to be measured. For example, a forward bias voltage under which no current is generated is applied to other intersecting places or a reverse bias voltage with an absolute value less than the threshold value, i.e. the absolute value of $V_2$ is applied, and then the photo-excited hole-electron pair cannot be collected by the electrodes at two sides due to the blocking by the first carrier selective layer and the second carrier selective layer.

Referring to FIG. 6, for example, in an embodiment, on the second electrodes 222a-222c, a voltage $V_{a2}$ is applied to the second electrodes 222a and 222c, and a voltage $V_{a1}$ is applied to the second electrode 222b. On the first electrodes 230a-230c at the other side, a voltage $V_{c2}$ is applied to the first electrodes 230a and 230c, and a voltage $V_{c1}$ is applied to the first electrode 230b. The four intersecting places 235a-235d in FIG. 6 have respective different cross voltages due to different voltages on an upper end and a lower end. The intersecting place 235a has a cross voltage with a value obtained by subtracting $V_{c2}$ from $V_{a2}$, the intersecting place 235b has a cross voltage with a value obtained by subtracting $V_{c1}$ from $V_{a2}$, the intersecting place 235c has a cross voltage with a value obtained by subtracting $V_{c1}$ from $V_{a1}$, and the intersecting place 235d has a cross voltage with a value obtained by subtracting $V_{c2}$ from $V_{a1}$. In the four cross voltages, one cross voltage needs to be adjusted so that the relative intersecting place operates under a reverse bias voltage in which an absolute value of the cross voltage is greater than the threshold value (i.e. the absolute value of $V_2$, while other cross voltages are all maintained in states of the forward bias voltage, zero bias voltage or a reverse bias voltage with an absolute value less than the threshold value, and then the photocurrent of a specific interesting place can be read. In this embodiment, one cross voltage is a reverse bias voltage with an absolute value greater than the first value $V_1$, and other cross voltages are between $V_2$ and $V_3$. In the above embodiment, the number of the first electrodes, the number of the second electrodes, and the values of the control voltage are used for reference, and may be changed for applying according to the actual cases. In the light detecting module, the principles of a hole current and an electron current are used so that a single light detecting module may independently read the photocurrent at each intersecting place.

Figure 7:
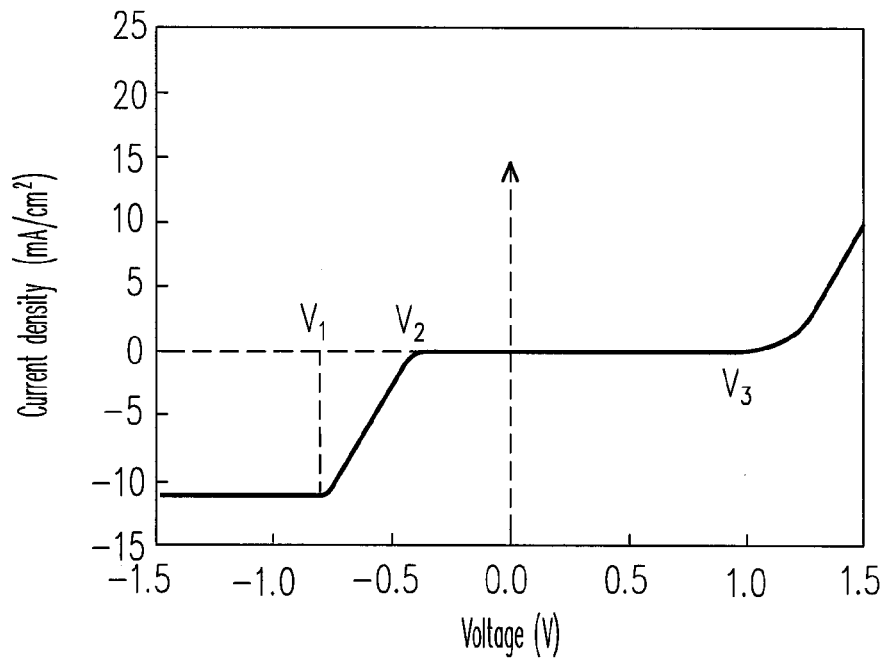
FIG. 7 is a schematic J-V curve graph of selection of a cross voltage in a light detecting array structure according to an exemplary embodiment.

The selection of the voltage of each of the first electrodes and the voltage of each of the second electrodes is determined by the control unit. FIG. 7 is a schematic current density to voltage curve (J-V curve) graph of selection of a cross voltage in a light detecting array structure according to an exemplary embodiment. When the cross voltage applied to the intersecting place of the light detecting array structure is less than a voltage value $V_1$, the intersecting place operates in an area in which an absolute value of a reverse bias voltage is greater than or equal to the first value (i.e. the absolute value of $V_1$). If the cross voltage is greater than a voltage value $V_2$ and less than a voltage value $V_3$, a current flowing through the intersecting place is 0 or close to 0, which is referred to as that the cross voltage at this time is located in a zero current area. In this embodiment, the values of $V_1$, $V_2$, and $V_3$ are controlled by different materials and structures of the devices and therefore are adjusted.

How to select a voltage value applied to each electrode is described in combination with FIG. 7 and the above embodiments. $V_{a1}$ and $V_{a2}$ are two kinds of voltages applied to the second electrodes, and $V_{c1}$ and $V_{c2}$ are voltages applied to the first electrodes. In the selection of the voltage value, a cross voltage value obtained by subtracting $V_{c1}$ from $V_{a1}$ is less than $V_1$ so that the intersecting place 235c is located in a reverse bias voltage area with an absolute value over the first value (i.e. the absolute value of $V_1$), and the other three cross voltage values obtained by subtracting $V_{c2}$ from $V_{a2}$, subtracting $V_{c1}$ from $V_{a2}$, and subtracting $V_{c2}$ from $V_{a1}$ are still within the zero current area and there is almost no photocurrent.

Figure 8:
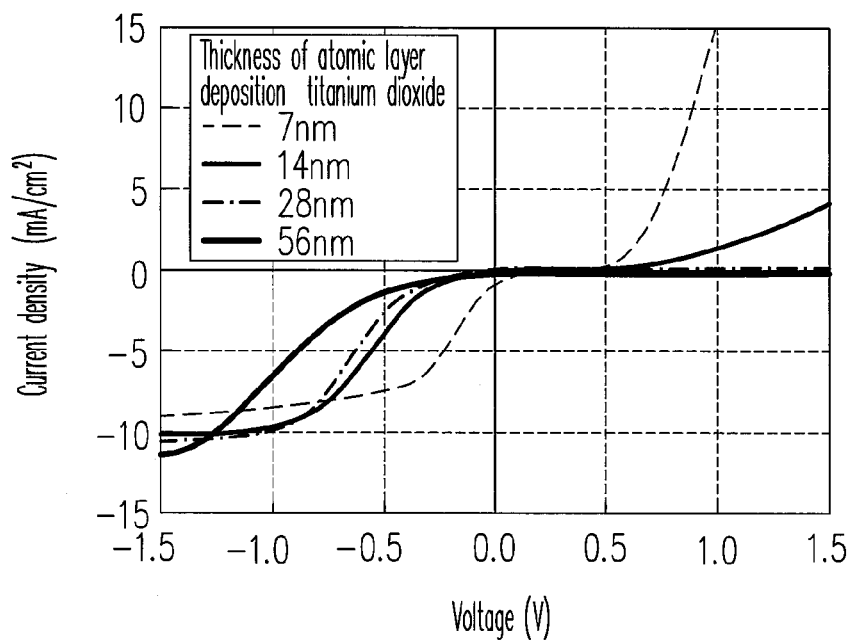
FIG. 8 is a schematic J-V curve graph of measurement of a photocurrent in the case of different thicknesses of a carrier selective layer according to an exemplary embodiment.

In the above modules, each of the first carrier selective layer 228, the light-absorbing active layer 226 and the second carrier selective layer 224 in the light detecting array 220 is a continuous film. The thickness of the carrier selective layer affects the measurement of the photocurrent. FIG. 8 is a schematic J-V curve graph of measurement of a photocurrent in the case of different thicknesses of a carrier selective layer according to an exemplary embodiment. According to FIG. 8, the first carrier selective layers 228 may be with different thicknesses such as 7 nm, 14 nm, 28 nm, and 56 nm, and a material of titanium dioxide is prepared by an atomic layer deposition. When the thickness of the film is 7 nm, the light detecting module 200 operates in a reverse bias voltage area with an absolute value over the threshold value, which is less than those of film with the thicknesses 14 nm, 28 nm, and 56 nm. However, when the absolute value of the forward bias voltage is over the second value (i.e. $V_3$), a capability of the carrier selective layer with 7 nm thickness of blocking the electron and the hole injected from the electrodes is poorer than that of the film with the thicknesses 14 nm, 28 nm, and 56 nm. The variations of the foregoing two bias voltage area are affected by the film thickness of the carrier selective layer.

Figure 9:
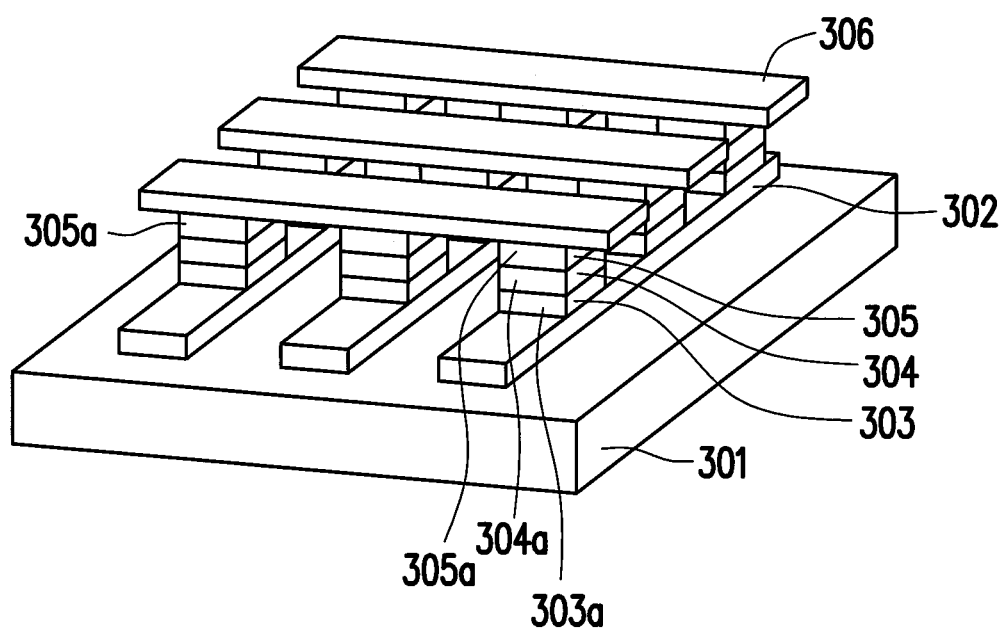
FIG. 9 is a schematic three-dimensional view of a light detecting array structure according to another exemplary embodiment.

FIG. 9 is a schematic three-dimensional view of a light detecting array structure according to another exemplary embodiment. Referring to FIG. 9, as described in the foregoing embodiment, in the light detecting module of the above embodiment, when a cross voltage is applied to the electrodes, the forward bias voltage and the reverse bias voltage is performed at the intersecting place of the electrodes. Based on the above, this embodiment also provides coating selection of a first carrier selective layer, a light-absorbing active layer, and a second carrier selective layer. According to FIG. 9, each of the first carrier selective layer 303, the light-absorbing active layer 304 and the second carrier selective layer 305 of this embodiment includes a plurality of film patterns 303a, 304a and 305a separated from each other. Each of the patterned films is disposed at the intersecting place of the first electrode 302 and the second electrode 306, and the first electrode and the second electrode are, for example, strip-like electrodes. The first electrode 302 are coated on a first substrate 301 which is a flexible substrate or a hard substrate, in which the flexible substrate is, for example, a plastic substrate, and the hard substrate is, for example, a glass substrate. This embodiment further includes a second substrate, not depicted, disposed at one side of the second electrode 306, which is not shown in FIG. 9 in order that FIG. 9 can clearly illustrate the coating selection of the first carrier selective layer, the light-absorbing active layer, and the second carrier selective layer. The design decreases the area of the coating film, and reduces the total amount of the materials to be used.

To sum up, in the light detecting array structure and the light detecting module according to the exemplary embodiments of the disclosure, the intersecting places of the first electrodes and the second electrodes unparallel to each other are configured to form multiple pixels, in the light detecting array structure and the light detecting module. It does not needs a thin film transistor as a switch of the pixel. Therefore, the manufacturing process of the light detecting array structure and the light detecting module may be simplified. The yield and the cost of manufacturing may be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light detecting array structure, comprising:
   a plurality of first electrodes;
   a plurality of second electrodes, disposed at one side of the first electrodes, wherein each of the first electrodes intersects each of the second electrodes, and a pixel is formed at an intersecting place of each of the first electrodes and each of the second electrodes;
   a first carrier selective layer, disposed between the first electrodes and the second electrodes, wherein the first carrier selective layer is an electron selective layer;
   a second carrier selective layer, disposed between the first carrier selective layer and the second electrodes, wherein the second carrier selective layer is a hole selective layer; and a light-absorbing active layer, disposed between the first carrier selective layer and the second carrier selective layer.

2. The light detecting array structure according to claim 1, wherein the first electrodes are substantially parallel to each other, and the second electrodes are substantially parallel to each other.

3. The light detecting array structure according to claim 1, wherein each of the first electrodes is substantially perpendicular to each of the second electrodes.

4. The light detecting array structure according to claim 1, wherein a material of the electron selective layer is titanium dioxide, and a material of the hole selective layer is poly(3,4-ethylenedioxythiophene) poly(styrenesulfonate).

5. The light detecting array structure according to claim 1, wherein a material of the electron selective layer is zinc oxide, and a material of the hole selective layer is molybdenum trioxide.

6. The light detecting array structure according to claim 1, wherein a work function of the first electrodes is different from that of the second electrodes, so that when the first electrodes and the second electrodes are in a state of a zero bias voltage, photo-excited electrons generated by the light-absorbing active layer are moved towards the second electrodes, photo-excited holes generated by the light-absorbing active layer are moved towards the first electrodes, and when a voltage applied to the first electrode minus a voltage applied to the second electrode is greater than or equal to a threshold value, the photo-excited electrons generated by the light-absorbing active layer are collected by the first electrode and the photo-excited holes generated by the light-absorbing active layer are collected by the second electrode.

7. The light detecting array structure according to claim 1, wherein at least one of the first electrode and the second electrode is a light transmissive electrode.

8. The light detecting array structure according to claim 1, wherein the light-absorbing active layer is an organic light-absorbing active layer.

9. The light detecting array structure according to claim 8, wherein a material of the organic light-absorbing active layer is a mixture of poly(3-hexylthiophene) and phenyl-C61-butyric acid methyl ester (P3HT:PCBM).

10. The light detecting array structure according to claim 1, wherein each of the first carrier selective layer, the second carrier selective layer and the light-absorbing active layer is a continuous film.

11. The light detecting array structure according to claim 1, wherein each of the first carrier selective layer, the second carrier selective layer and the light-absorbing active layer comprises a plurality of film patterns separated from each other, and each film pattern is disposed at an intersecting place of each of the first electrodes and each of the second electrodes.

12. A light detecting module, comprising:
a light detecting array structure, comprising:
a plurality of first electrodes;
a plurality of second electrodes, disposed at one side of the first electrodes, wherein each of the first electrodes intersects each of the second electrodes, and a pixel is formed at an intersecting place of each of the first electrodes and each of the second electrodes;
a first carrier selective layer, disposed between the first electrodes and the second electrodes;
a second carrier selective layer, disposed between the first carrier selective layer and the second electrodes; and a light-absorbing active layer, disposed between the first carrier selective layer and the second carrier selective layer; and
a control unit, coupled to the first electrodes and the second electrodes, and configured to selectively provide at least two cross voltages between each of the first electrodes and each of the second electrodes and read photocurrents flowing through the first electrodes and the second electrodes.

13. The light detecting module according to claim 12, wherein the first electrodes are substantially parallel to each other, and the second electrodes are substantially parallel to each other.

14. The light detecting module according to claim 12, wherein each of the first electrodes is substantially perpendicular to each of the second electrodes.

15. The light detecting module according to claim 12, wherein the first carrier selective layer is an electron selective layer, and the second carrier selective layer is a hole selective layer.

16. The light detecting module according to claim 15, wherein a material of the electron selective layer is titanium dioxide, and a material of the hole selective layer is poly(3,4-ethylenedioxythiophene) poly(styrenesulfonate).

17. The light detecting module according to claim 15, wherein a material of the electron selective layer is zinc oxide, and a material of the hole selective layer is molybdenum trioxide.

18. The light detecting module according to claim 15, wherein a work function of the first electrodes is different from that of the second electrodes, so that when the first electrodes and the second electrodes are in a state of a zero bias voltage, photo-excited electrons generated by the light absorbing active layer move towards the second electrodes, photo-excited holes generated by the light absorbing active layer move towards the first electrodes, and when a voltage applied to the first electrode minus a voltage applied to the second electrode is greater than or equal to a threshold value, the photo-excited electrons generated by the light absorbing active layer are collected by the first electrode and the photo-excited holes generated by the light absorbing active layer are collected by the second electrode.

19. The light detecting module according to claim 18, wherein when the voltage applied to the first electrode minus the voltage applied to the second electrode is greater than or equal to the threshold value, the photocurrent flowing through the first electrode and the second electrode is generated by the light absorbing active layer and read out by the control unit.

20. The light detecting module according to claim 18, wherein the at least two cross voltages comprise a first cross voltage and a second cross voltage each of which is defined as the voltage of the first electrode minus the voltage of the second electrode, the first cross voltage is less than the threshold value, and the second cross voltage is greater than the threshold value.

21. The light detecting module according to claim 20, wherein when the voltage applied to the first electrode minus the voltage applied to the second electrode is positive and is greater than a first value, the photocurrent is in a saturation state, wherein the first value is greater than the threshold value, and when the voltage applied to the second electrode minus the voltage applied to the first electrode is positive and is greater than or equal to a second value, a current is forced to flow through the second electrode, the second carrier selective layer, the light-absorbing active layer, the first carrier selective layer, and the first electrode in sequence, and wherein the first cross voltage is less than the threshold value when the first cross voltage is positive or zero, the absolute of the first cross voltage is less than the second value when the first cross voltage is negative, and the second cross voltage is greater than the first value.

22. The light detecting module according to claim 20, wherein the control unit is configured to selectively provide a first voltage and a second voltage to the first electrode, selectively provide a third voltage and a fourth voltage to the second electrode, a value obtained by subtracting the third voltage from the first voltage is greater than the threshold value, a value obtained by subtracting the fourth voltage from the first voltage is less than the threshold value, a value obtained by subtracting the third voltage from the second voltage is less than the threshold value, and a value obtained by subtracting the fourth voltage from the second voltage is less than the threshold value.

23. The light detecting module according to claim 12, wherein at least one of the first electrode and the second electrode is a light transmissive electrode.

24. The light detecting module according to claim 12, wherein the light absorbing active layer is an organic light absorbing active layer.

25. The light detecting module according to claim 24, wherein a material of the organic light absorbing active layer is a mixture of poly(3-hexylthiophene) and phenyl-C61-butyric acid methyl ester (P3HT:PCBM).

26. The light detecting module according to claim 12, wherein each of the first carrier selective layer, the second carrier selective layer and the light absorbing active layer is a continuous film.

27. The light detecting module according to claim 12, wherein each of the first carrier selective layer, the second carrier selective layer and the light absorbing active layer comprises a plurality of film patterns separated from each other, and each film pattern is disposed at an intersecting place of each of the first electrodes and each of the second electrodes.

28. A light detecting array structure, comprising:
a plurality of first electrodes;
a plurality of second electrodes, disposed at one side of the first electrodes, wherein each of the first electrodes intersects each of the second electrodes, and a pixel is formed at an intersecting place of each of the first electrodes and each of the second electrodes;
a first carrier selective layer, disposed between the first electrodes and the second electrodes;
a second carrier selective layer, disposed between the first carrier selective layer and the second electrodes; and
a light-absorbing active layer, disposed between the first carrier selective layer and the second carrier selective layer, wherein the light-absorbing active layer is an organic light-absorbing active layer.

* * * * *